United States Patent [19]
Marek

[11] 4,314,200
[45] Feb. 2, 1982

[54] METHOD AND APPARATUS FOR DETECTION OF MAGNETIZATION

[75] Inventor: Alois Marek, Nussbaumen, Switzerland

[73] Assignee: BBC Brown, Boveri & Company Limited, Baden, Switzerland

[21] Appl. No.: 829,811

[22] Filed: Sep. 1, 1977

[51] Int. Cl.³ .................... G01R 19/00; G01R 33/00
[52] U.S. Cl. .................. 324/117 R; 324/127; 324/253
[58] Field of Search ............ 324/127, 117 R, 117 H, 324/253, 251; 332/12

[56] References Cited
U.S. PATENT DOCUMENTS

| | | | |
|---|---|---|---|
| 2,990,516 | 6/1961 | Johannessen | 332/12 |
| 3,384,838 | 5/1968 | Knutrud | 332/12 |
| 3,454,879 | 7/1969 | Smitka | 324/117 R |
| 3,568,052 | 3/1971 | Anderson | 324/253 |
| 3,768,011 | 10/1973 | Swain | 324/117 R |
| 3,812,428 | 5/1974 | Trenkler | 324/117 R |

Primary Examiner—Ernest F. Karlsen
Attorney, Agent, or Firm—Werner W. Kleeman

[57] ABSTRACT

A method of, and apparatus for, the detection of magnetization of a magnetic circuit, especially for the detection of a current flow interlinked with the magnetic circuit, wherein a timed or temporal cyclic magnetic flux change is generated by means of a detection-current flow used for detection purposes and interlinked with the magnetic circuit and a detection signal is formed as a function of time intervals dependent upon the magnetization.

31 Claims, 13 Drawing Figures

METHOD AND APPARATUS FOR DETECTION OF MAGNETIZATION

BACKGROUND OF THE INVENTION

The present invention relates to a new and improved method of detecting so-called pre-magnetization or magnetization of a magnetic circuit, in particular for the detection of a current flow interlinked with the magnetic circuit. The invention further relates to apparatus for the performance of such method.

Magnetic circuits, generally in the form of highly permeable and especially ferromagnetic cores, are suitable for the detection of magnetic fields by virtue of the magnetization present in the magnetic circuit, which magnetization, in the description to follow, for the purpose of differentiating from an additionally induced detection magnetization for producing required detection signals, may be sometimes referred herein to as "pre-magnetization", but for simplicities sake is usually referred to hereinafter as simply "magnetization". When such pre-magnetization or magnetization corresponds to a current flow interlinked with the magnetic circuit, then there is produced a current detection, especially, for instance, a null current detection.

SUMMARY OF THE INVENTION

It is a primary object of the present invention to provide an improved method of, and apparatus for, reliably detecting magnetization and especially a corresponding current flow with very little equipment expenditure.

Another important object of the present invention is to devise a novel method of, and apparatus for, detecting a current flow in a highly efficient, reliable and simple manner, by accomplishing an appropriate detection of magnetization of a magnetic circuit.

The inventive method for the detection of a so-called pre-magnetization or magnetization of a magnetic circuit, especially for the detection of a current flow interlinked with the magnetic circuit, is manifested by the features that a temporal cyclic magnetic flux change is produced by means of a detection-current flow interlinked with the magnetic circuit, and a detection signal is formed as a function of magnetization dependent-time intervals.

The apparatus for the performance of the method is manifested by the features that there is provided at least one detection current circuit interlinked with the magnetic circuit as well as a supply source having a cyclic current-or voltage time course. At least one threshold value or limit switch is connected with the detection current circuit, the threshold value switch being provided with a subsequently arranged time interval detector.

The magnetic flux change produced in the magnetic circuit, in addition to the so-called pre-magnetization or magnetization i.e. the current flow which is to be detected, and the corresponding current flow renders possible the determination of time intervals, which directly or in the form of a suitable function derived from such time intervals—e.g. a relationship of time intervals—characterize a so-called pre-magnetization or magnetization state which is to be considered as static in relation to the cyclic detection-magnetic flux change or a corresponding current. Such time intervals and functions derived therefrom can be comparatively simply ascertained, with very little equipment expenditure, with the aid of conventional means available in analog or digital electronics, and in comparison to the direct detection of a current- or voltage amplitude, are manifested by great insensitivity to disturbance magnitudes and fluctuations in the method- and circuit parameters, such as temperature, manufacturing tolerances of the electronic components and the like.

A particularly advantageous embodiment of the method is manifested by the features that the detection signal is formed as a function of time intervals which pass between predetermined values during the cyclic magnetic flux change of the detection-current flow or magnitudes dependent upon such detection-current flow used for detection purposes. Especially for the detection of current flow interlinked with the magnetic circuit there is provided a high detection sensitivity because due to such a magnetization or pre-magnetization-current flow the magnetization characteristic curve (magnetic flux as a function of the detection-current flow) is shifted in the direction of the current- or intensity axis and the time intervals markedly change with the magnetization-current flow during throughpass of the magnetization characteristic curve between predetermined values of the current or a magnitude functionally linked with the current. Moreover, the use of interval determining current-limit values, while advantageous in a number of aspects, nonetheless is not absolutely necessary. There also basically come into consideration the possible use of other, for instance, relative boundary values, such as maxima, minima or null throughpassage of the current or a suitable voltage.

In particular there can be advantageously introduced current values of opposite sign for the interval determination, especially those of the same magnitude. This not only provides for simple possibilities of circuit design, but also the possibility of producing certain, usually desired symmetry properties of the time intervals as a function of the magnetization-current flow. Particularly simple conditions are realized when using the current null throughpass for the interval determination.

Furthermore, the interval-determining current values can be accommodated, in relation to a predetermined reference-magnetization state, to certain exceptional points of the—generally in any event non-linear—magnetization characteristic curve. Thus, there are obtained interval-determining current values at the region of turning points of the magnetization characteristic curve (magnetic flux as a function of the detection-current flow) in a predetermined reference-magnetization state of a particularly large sensitivity of the detection-time interval or a function of such time intervals with regard to a change of the magnetization to be detected i.e. the current to be detected. The aforementioned reference-mangetization state constitutes the starting condition or null point of the detection. For the special function of a current-null detection there is thus advantageously available the magnetization state of the magnetic circuit without interlinked current flow, which hereinafter will be simply referred to as "null magnetization" with the corresponding "null characteristic curve". The latter therefore constitutes the magnetization characteristic curve only under the influence of the cyclic time cource of the detection-current flow, and in the following discussion there will be assumed simplified cycles with coincident starting- and end current values. In the case of null symmetrical detection-current modulation or control the null characteristic curves thus constitute commutation curves; in the case of a magnetic circuit with pronounced saturation and modulation up to saturation such constitute limit or threshold curves.

In the case of magnetic circuits of the last-mentioned type there advantageously come into consideration especially the use of interval-determining current values in the saturation regions of the null characteristic curve or another reference-magnetization characteristic curve, especially the pairwise use of opposite saturation regions. The mere interval determination by current values in the saturation region presupposes—as will be explained more fully in detail hereinafter—a not purely constant speed of change of the magnetic flux between the saturation-boundary or limit points. Independent of predetermined magnetic flux-time courses there also come into consideration the use of interval-determining current values into the saturation regions, however in combination with other interval-determining current values during the course of the cyclic throughpass of the magnetization characteristic curve. Generally, the use of interval-determining current in the saturation region affords the advantage of comparatively lower accuracy requirements with respect to the current threshold or limit values, because the saturation sections of the magnetization characteristic curve are passed through at comparatively great speed in relation to one and the same change in speed of the magnetic flux and therefore only slight come into consideration in the determination of the total interval duration.

Furthermore, the interval-determining current values can be placed with special advantage into the region of the null throughpass of the magnetic flux in a reference-magnetization characteristic curve with hysteresis, i.e. in the region of the coercive points of a conventional ferromagnetic magnetization characteristic curve, for which purpose there especially is present slight sensitivity against non-systematic deviations of the change in speed of the magnetic flux from the set reference values in the different time intervals or characteristic curve sections.

Moreover, it has been found that the interval-determination need not be absolutely carried out to both sides of the entry of predetermined current values or corresponding magnitude values. Quite to the contrary, it is possible, for instance, to basically work with partially fixedly predetermined temporal interval boundaries, approximately with a fixed cycle duration of the detection-current flow in conjunction with magnetization-dependent time interval boundaries within such cycle duration.

As the detection function (detection signal as a function of magnetization-dependent time intervals) there come into consideration preferred conditions owing to the simple realizable and disturbance insensitivity, especially the pulse duty factor of the cyclic time course of the detection-current flow or a magnitude dependent therefrom. While assuming that such time course is placed into a binary state each time at the null throughpass there should be understood in the present context as the "pulse duty factor" the relationship of the time interval appearing at a binary value or the sum of a number of such intervals within a cycle of the total cycle duration. Now if there is accomplished a null-symmetrical binary operation (switching between positive and negative values of the same magnitude), then, the direct-current components which constitute a pulse sequence (assumed to be stationary) directly provide the pulse duty factor which can therefore be easily obtained by low-pass filtering.

The time course of the interval-forming detection magnitudes (detection-current flow or a magnitude dependent therefrom)—apart from the magnetization characteristic curve representing the magnitude to be detected—is determined from the time course of the magnetic flux and the properties of the detection current circuit interlinked with the magnetic circuit. Belonging to the detection current circuit is especially the current-voltage characteristic curve of the current source which powers the detection current circuit. This also is true for the time behavior of such current source, however beyond such initially there need only be fulfilled one precondition, in random manner, which brings about the cyclic throughpass of the magnetization characteristic curve. This can be basically achieved by a periodically changing electromotive force, by for instance current- or voltage-dependent switching between different supply sources or between different current-voltage characteristic curves of a supply source or the like.

On the other hand, what is decisive for the detection effect is the generation of a magnetic flux change, for which purpose there is required in any event a suitable current flow in the detection current circuit interlinked with the magnetic circuit, and the determination of a magnitude (detection magnitude) dependent upon the magnetization state with a time course governed by the magnetic flux change, during which there can be determined the magnetization-dependent time intervals. To the extent that the magnetization-dependency is given, there basically come into consideration currents as well as voltages for the detection magnitudes. Consequently, there are also fixed the basic conditions for the supply of the detection current circuit to the extent that, on the one hand, the magnetic flux change is to be generated by such supply, and, on the other hand, however there is to be obtained from the detection current circuit the magnetization-dependent detection magnitude. If, for instance, there is used the current as the detection magnitude, then the internal resistance of the supply source must not be too large (impressed voltage). The corresponding converse conditions are also true for the use of the terminal voltage of the supply source or a detection winding of the magnetic circuit as the detection magnitude. Furthermore, the reduction of the detection magnitude need not be carried out directly in the detection current circuit. Quite to the contrary, there is possible a decoupling of suitable detection magnitudes, such as current or voltage also by means of special current circuits.

The cyclic throughpass of the magnetization characteristic curve is advantageously obtained by reversing the sign of the change in speed of the magnetic flux, e.g. by reversing the polarity of the supply voltage. In the interest of simple circuitry design there is thus advantageously produced in the magnetic circuit a magnetic flux having a time course which at least encompasses a pair of intervals with change in speed of the magnetic flux of at least approximately coincident magnitude and opposite sign. Within one such interval of the same sign of the change in speed of the magnetic flux it is then possible to work especially with time sections of constant magnitude of such change in speed. In consideration of the typical non-linear course of the magnetization characteristic curve of conventional highly permeable materials possessing saturation, it can be advantageous to reduce the influence of certain characteristic curve regions by more rapid throughpassage i.e. with greater change in speed of the magnetic flux, or conversely, to increase the influence of other regions by a slower throughpassage i.e. with lower change in speed of the magnetic flux. For this purpose there can be set within a cycle of the time course of the change in speed of the magnetic flux at least two intervals with different, preferably in each case time-constant, magnitude and the same sign of the change of speed of the magnetic flux.

Basically, there can be introduced for the variation of the speed change of the magnetic flux according to magnitude and/or sign, for instance a constant time frame. In particular, there is recommended, however, resolution of these changes as a function of reaching at least one predetermined value of the detection-current flow or a magnitude dependent therefrom. The thus completely or partially obtainable autonomy of the time-course modulation or control provides a corresponding compensation of disturbance magnitudes. Accordingly, the cyclic throughpass of the magnetization characteristic curve thus can be obtained in that there is accomplished a sign reversal of the change in speed of the magnetic flux as a function of reaching end or terminal values of opposite sign of the detection-current flow or the magnetic flux, and such end values for all of the values of the magnetization to be detected must be located in the saturation region of the magnetization characteristic curve. In the case of a hysteresis-magnetization characteristic curve, and starting from the saturation region, there always then will be throughpassed the boundary or limit curves, so that the momentary effective magnetization of preceding magnetization states are without influence.

For the previously mentioned accentuation of characteristic curve regions which are more productive for the measurement effect—in general regions which are steeper with regard to the current flow axis—there come under consideration, while taking into account the advantage of an autonomous time control, a variation in the speed of change of the magnetic flux as a function of an at least approximate attainment of the value null of the detection-current flow. This reversing especially has the advantage of a simple and exactly reproducible switching criterion. Moreover, this reversal alone cannot bring about any cyclic throughpass of the magnetization characteristic curve and therefore should be combined with an end value reversal, for instance one at both sides of the saturation regions as previously explained. This also is valid for a reversal at the turning points of the magnetization characteristic curve, which, moreover, produce a particularly great detection sensitivity with regard to displacement of the magnetization characteristic curve in the direction of the current flow axis. As simple adjustable approximation of the turning points there furthermore come into consideration, in the case of simple type hysteresis loops, the coercive points, i.e. the null throghpass of the magnetization characteristic curve. In both of the last-mentioned embodiments there is to be presupposed for the adjustment of the flow- or magnetic flux values of the contemplated reversal of the change in speed of the magnetic flux of a certain magnetization state, for instance the previously above-mentioned null magnetization.

A generalization of the throughflow-dependent control of the change in speed of the magnetic flux leads to powering the detection current circuit by a function generator with predetermined current-voltage characteristic curve, which, in consideration of the requirement of the cyclic throughpass of the magnetization characteristic curve, must possess a hysteresis-like course with at least one positive and one negative voltage branch. By virtue of the free design possibilities of the current-voltage characteristic curve of such a general supply voltage, which can be readily obtained with conventional electronic circuits, there can be realized optimum accommodations for different types of detection functions and disturbance conditions.

The cyclic throughpassage of the magnetization characteristic curve is obtained with a supply of the last-mentioned type by advantageously switching between different functions of the magnetic flux-speed change as a function of reaching a predetermined value of the detection-current flow or the magnetic flux, and specifically, advantageously by switching between functions which in each case are free of null positions and possess signs which are opposite to one another. Since a switching of the last-mentioned type constitutes a reversal of the travel direction in the magnetization characteristic curve and thus generally also a direction reversal of the current flow-change, there is here to be eliminated surging about the switching point by a one sided directed reversal or a one sided direction-dependency upon reaching the predetermined switching point in the magnetization characteristic curve. This can be particularly easily obtained in the end points of the modulation and advantageously is avoided with the last-mentioned mode of operation within the individual function regions.

Particular advantages are generally afforded by virtue of the more or less approximate impressing of a voltage in a current path interlinked with the magnetic circuit, advantageously in the detection current circuit for determining the time change of the magnetic flux. In the case of adequate low internal resistance of the supply voltage in relation to a given inductance and a likewise effective resistance of the remaining current path, this signifies a change in speed of the magnetic flux of low current flow or current dependency. The current changes which appear thus constitute a particularly sensitive measure for the magnetization which is to be detected, and specifically are even more pronounced in the case of an at least timewise constant voltage or magnetic flux-speed change, which moreover can be realized with especially simple circuitry.

BRIEF DESCRIPTION OF THE DRAWINGS

The invention will be better understood and objects other than those set forth above, will become apparent when consideration is given to the following detailed description thereof. Such description makes reference to the annexed drawings wherein.

DETAILED DESCRIPTION OF THE PREFERRED EMBODIMENTS

Figure 1:
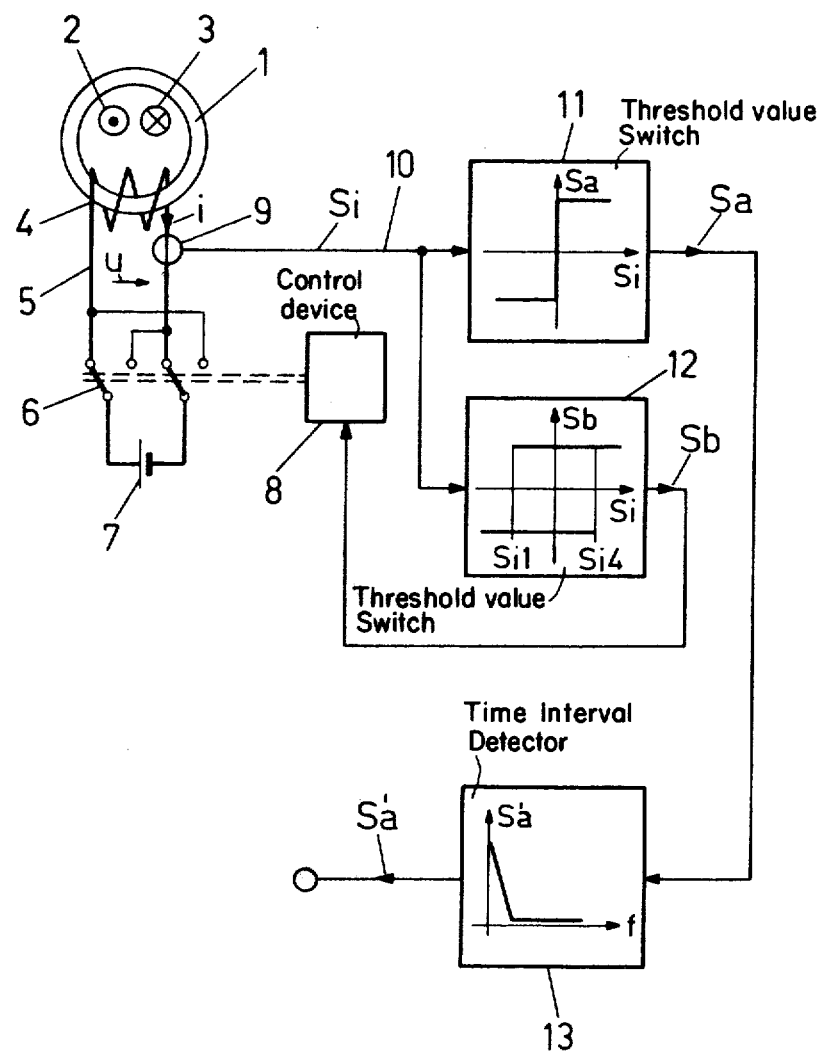
FIG. 1 is a principal circuit diagram of an apparatus for the null current detection by means of magnetization of a magnetic circuit.

Describing now the drawings, the circuit of FIG. 1 will be seen to comprise a magnetic circuit 1 in the form of a ring core, by means of which there is coupled or interlinked a current flow which is to be monitored, for instance, by some of the currents flowing through a number of conductors or lines 2 and 3. Furthermore, there is coupled with the magnetic circuit 1 a winding 4 of a detection current circuit 5 composed, for instance, of a number of convolutions or coils, the detection current circuit 5 being power supplied by a suitable source 7 through the agency of a polarity reversal switch 6. By appropriate actuation of the reversal switch 6 by means of a control device 8 there is produced in the detection-current circuit 5 a timewise or temporal cyclically changing detection-current flow which is proportional to the current i in the detection current circuit. In the simplest case where there is used a direct-current voltage source 7 the voltage u which is applied to the winding 4 can be considered as constant in magnitude with changing sign, provided that the voltage drop at the internal resistance of the source 7 is sufficiently small in relation to that at the winding 4. Furthermore, if with sufficient inductance of the winding 4 with regard to its ohmic resistance the voltage drop at the latter can be considered as negligible, then there is directly induced by the voltage source (terminal voltage) a proportional change in speed of the magnetic flux in the magnetic circuit. The cyclic time course of this magnetic flux change is obtained in the present simple situation under discussion by the polarity reversal. For the automatic triggering of such reversal there come under consideration different criteria, certain of which will be especially treated hereinafter.

By means of a current converter 9 having an output signal Si (current signal) proportional to the current i there is connected with the current circuit 5 a detection signal circuit 10 having at its input side two parallelly connected threshold or limit value switches 11 and 12. According to the graphs of the momentary output signals Sa and Sb plotted as a function of the current signal Si and schematically shown in the blocks of such threshold value switches, one is here concerned with elements having binary, null-symmetrical output signal, and furthermore, in the case of the switch 11 with a single switching threshold value $Si = O$ and in the case of the switch 12 with two null-symmetrical threshold values $Si = Si1$ and $Si = Si4$. The output of the switch 11 is connected to a time interval detector 13 constructed as a low-pass filter, and the output signal $S_a'$ (plotted in the block symbol as a function of the frequency f) is a function of time intervals which are formed as a function of the magnetization of the magnetic circuit 1 and thus form the resultant magnetization-current flow of the conductors 2 and 3 during the cyclic time course of the detection current i.

The detection-current flow need only sufficiently distinguish itself from the magnetization-current flow and the current to be detected merely by the cycle time of its time course. The magnetization or so-called pre-magnetization i.e., currents to be detected can change as a function of time, provided only the change, within a cycle interval, is sufficiently small in relation to the stroke change of the detection current. Moreover, the cyclic time course of the detection current and the magnetic flux change with constant duration of the cycle intervals transforms into a periodic time course, and there are valid appropriate conditions for the period duration of the aforementioned time course. Generally, for the sake of simplicity there are employed periodic time courses of the magnetic flux change, but however there also come into consideration cyclic time courses with variable cycle duration, for instance with changing speed of the magnetization which fluctuates throughout wide regions or ranges. In the description to follow the magnetization will be considered to be constant during the cycle duration. During the cyclic detection-magnetic flux change there will be accordingly passed through a magnetization characteristic curve (magnetic flux as a function of the detection-current flow or detection current) which, at least as concerns its position, is dependent upon the magnetization to be detected and thus upon the current flow to be detected. As the reference magnetization there will be thus assumed in the following description the already previously defined null magnetization.

In the example of FIG. 1 the cycles of the detection-magnetic flux change are brought about by polarity reversal of the voltage u as a function of reaching the predetermined current signal threshold values Si1 and Si4. Furthermore, the output of the threshold value or limit switch 12 is connected at an input of the control device 8 which is responsive to the changing polarity of Sb by carrying out appropriate opposite switching operations.

Figure 2:
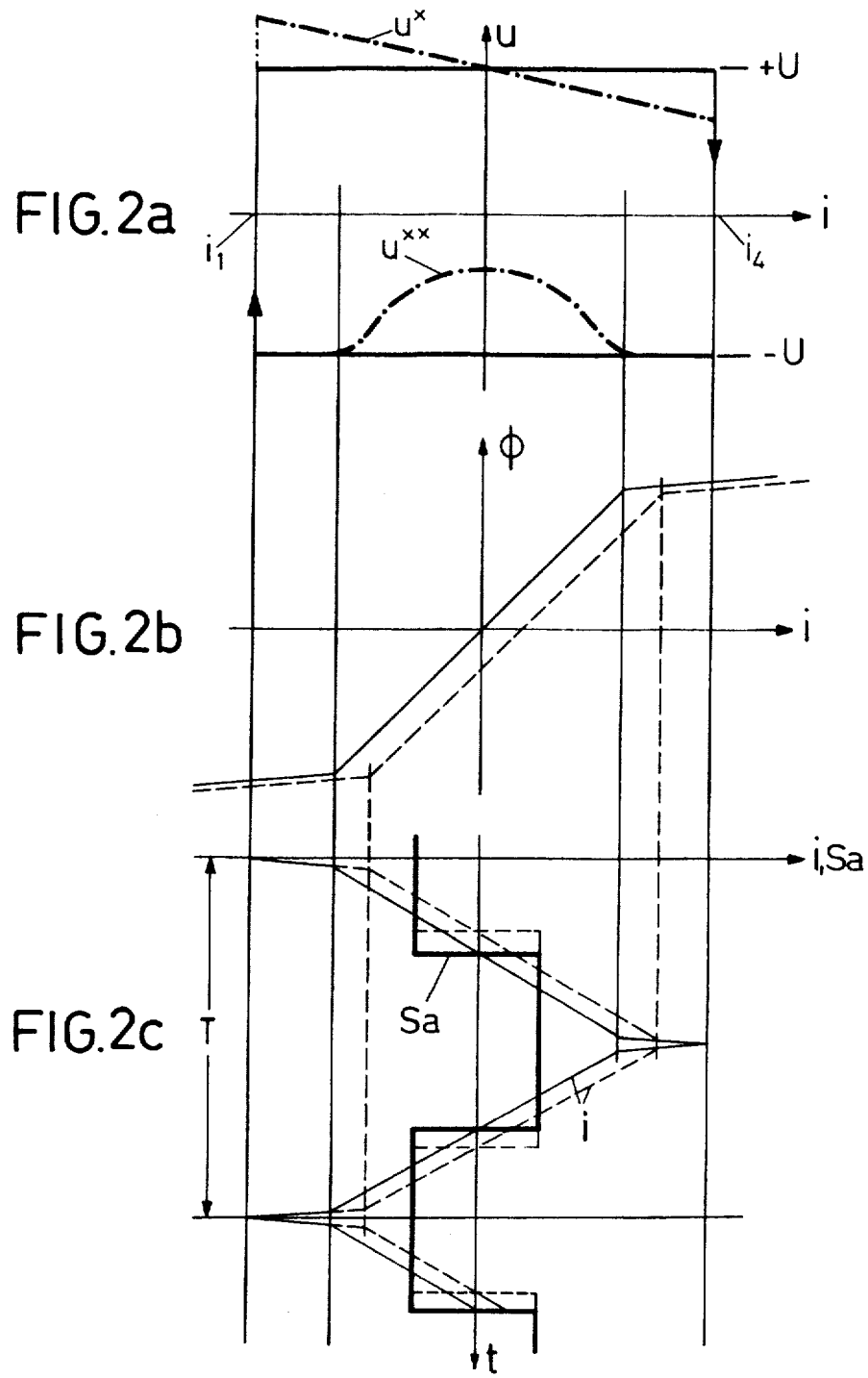
FIG. 2a is a graph of the voltage-current curve of a supply voltage for producing a detection current flow with cyclic time course.
FIG. 2b illustrates the linearly simplified course of the magnetization characteristic curve of the magnetic circuit (magnetic flux as a function of the detection current corresponding to the detection-current flow)
FIG. 2c is a time diagram of the detection current corresponding to the supply characteristic curve (voltage-current curve of the supply source) according to FIG. 2a and the magnetization characteristic curve according to FIG. 2b.

The power source 7 and the reversing switch 6 collectively form a detection-supply source having a hysteresis-shaped voltage-current characteristic curve, as indicated in full lines in FIG. 2a. The detection-supply source is to be considered as constituting a function generator. The aforementioned characteristic curve encompasses the inherently stable branches $u = +U$ and $u = -U$, at the ends of which there is carried out a switching operation in the sense indicated by the arrows and specifically at the current values $i_1$ and $i_4$ which are associated with the current signal values Si1 and Si4 according to FIG. 1. Between these current threshold or limit values there passes the magnetization characteristic curve $\Phi$ as a function of i and assumed for the sake of simplicity in FIG. 2 to be linear as well as without hysteresis. The null characteristic curve is shown in full lines, the magnetization characteristic curve which is shifted owing to the magnetization to be detected is shown in broken lines. For the detection current i there thus results a curve course as a function of time t as shown in FIG. 2c, and specifically, the full lines indicate the null characteristic curve and the broken lines the magnetization to be detected. Furthermore, in FIG. 2c there is indicated the time course of the output signal Sa of the threshold value switch 11, i.e. a binary null-symmetrical signal with the period or cycle duration T and the null throughpasses in those of the detection current i. A comparison of the time course indicated in full lines and in broken lines for the null magnetization and the magnetization which is to be detected immediately shows a clear change of the pulse factor or switching relationship determined by the time intervals between the null throughpasses, and from which there can be derived a corresponding change of the direct-current component of Sa in the form of the low-pass filtered signal $S_a'$. The latter thus constitutes the desired detection signal as a function of the magnetization-dependent time intervals.

In FIG. 2a there is furthermore still shown the possibility of working with other than current-constant supply voltage functions. The chain-dot curve section $u^x$ is valid for a comparatively high internal resistance of the supply source, whereas the curve section $u^{xx}$—likewise shown in broken or chain-dot lines—is valid for a source with corresponding non-linear voltage-current characteristic curve. As to the first-mentioned curve there results a non-constant time course of also the supply voltage, so that, if desired, there can be derived therefrom a detection signal, whereas a drop of the supply voltage according to $u^{xx}$ in a corresponding section of the null characteristic curve can result in a more pronounced effect of the magnetization-dependent curve shifts.

What is here further to be mentioned is that a supply source exhibiting in totality a hysteresis-like current-voltage characteristic curve of the type shown in FIG. 2a can be basically realized by means of an oscillator, for instance a relaxation oscillator or an astable flip-flop circuit, if desired, while utilizing suitable non-linear elements for influencing the individual characteristic curve sections.

Figure 3:
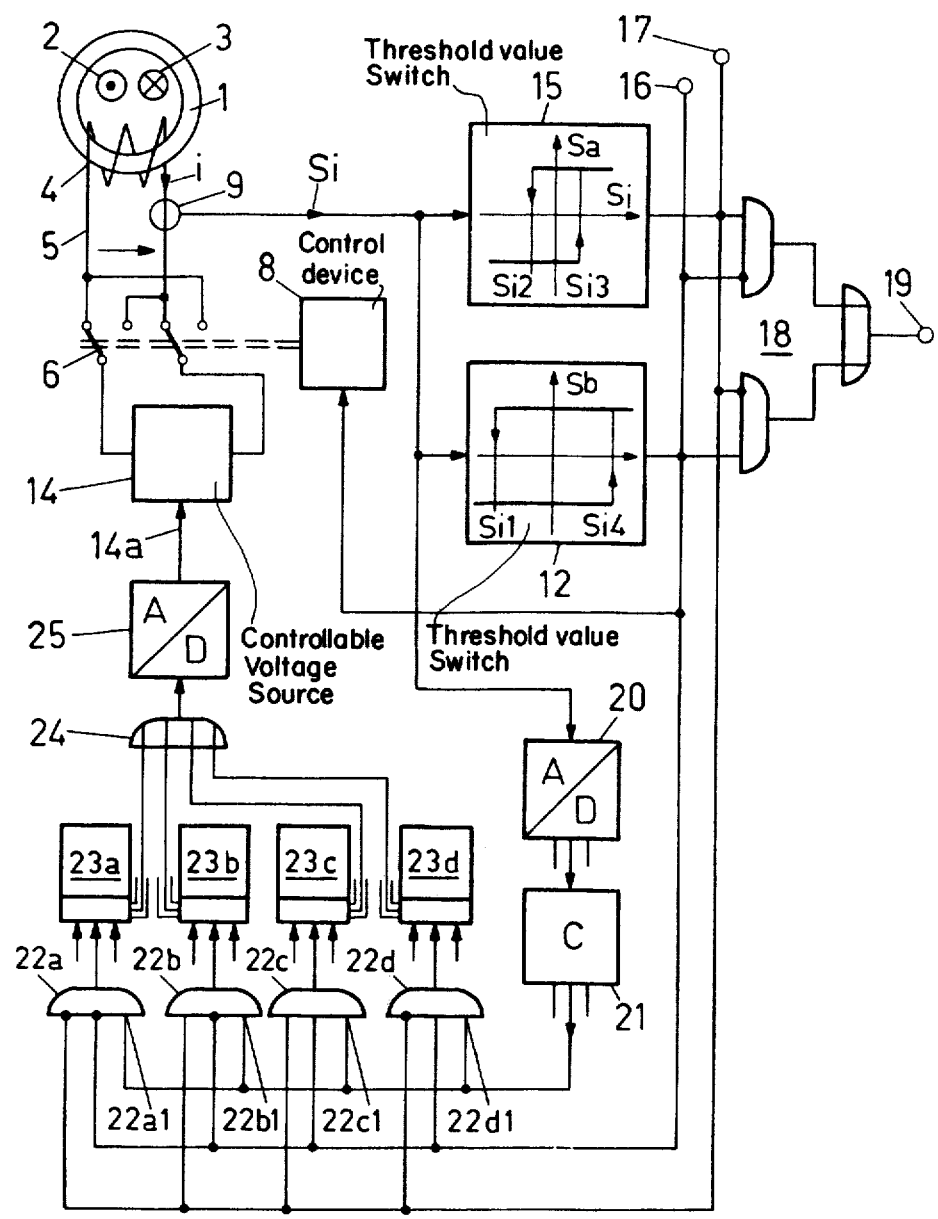
FIG. 3 is a circuit diagram of another embodiment of an apparatus for the null current detection.

The circuitry of FIG. 3 is not different from the circuitry of FIG. 1 as concerns the components or elements 1, 2, 3, 4, 5, 6, 8 and 12, whereas there is used in place of the simple voltage source 7 a source 14 having a terminal voltage which can be controlled in magnitude by means of a control input 14a and in place of the hysteresis-free thresold value switch 11 there is employed a threshold value or limit switch 15 having hysteresis-switching threshold or limit values Si2 and Si3 corresponding to the curves plotted in the blocks for Sa as a function of Si. These changes and other modifications which will be explained hereinafter allow for special optimized detection processes. The controllable voltage source 14 in connection with a current-dependent control circuit and the polarity reversal switch 6 already described in conjunction with the circuitry of FIG. 1 as well as its control device 8 assumes the function of a supply source with programmable voltage-current characteristic curve and automatic, especially current-dependent switching between a characteristic curve section having positive and one having negative voltage. The slope and curvature of the characteristic curve sections can be additionally influenced by an appropriate internal resistance of the voltage source and non-linear circuit elements, whereas in the embodiment under discussion there is assumed a step-like composition of the characteristic curve from sections each having current-independent, yet programmable-variable voltage magnitudes. It should be understood that such a function generator can be realized by means of a supply source, if desired, by a suitable oscillator or the like.

Additionally, the current-dependent control device constitutes the detector part of the circuitry where there are formed different types of detection signals as a function of time intervals from the time course of the detection current.

Starting from the circuit components which coincide with those shown in FIG. 1 and the already mentioned threshold value or limit switch 15, according to the showing of FIG. 3 there is provided a logic circuit 18 which logically couples the binary output signals of both threshold value switches 15 and 12 by logical antivalence (Exclusive-OR) and delivers an appropriate time interval-dependent detection signal to an output 19. On the other hand, there can be directly tapped-off at the outputs 16 and 17 other types of likewise binary detection signals.

By means of the switching threshold values Si3 and Si4 the modulation range of the current i during passage in the direction of increasing current and by means of the switching threshold values Si2 and Si1 during passage in the direction of decreasing current, is always subdivided into two sections, and there is associated with each section a binary output signal combination, i.e. a two place binary number, of the threshold value switches 12, 15. Accordingly, the outputs of such switches lead to a logic circuit 22, which is provided at the input side for each of the aforementioned output signal combinations with a parallel connected group of AND-gates 22a, 22b, 22c and 22d. In FIG. 3 there has only been illustrated in each case one AND-gate for each group. Upon the appearance of an output signal combination, in other words when the current i increasingly or decreasingly is located in a certain section of the modulation range, there is thus always prepared in each case an associated group of the AND-gates 22a to 22d for the delivery of a yes-type output signal, which still depends upon in each case a further input 22a1, 22b1, 22c1, 22d1. If each group of AND-gates 22a, 22b, 22c, 22d encompasses for instance three gates, then there are available the further inputs 22a2, 22a3; 22b2, 22b3; 22c2, and so forth. All of the inputs 22a1, 22b1, 22c1, 22d1 are collectively connected to a not particularly referenced output of a coder 21, the further inputs 22a2, 22b2, and so forth as well as 22a3, 22b3 and so forth, are each connected to another associated output of this coder, which, in turn, is controlled by means of an analog-digital converter 20 by means of the current signal Si. In total then for each output signal combination Sa, Sb of the threshold value or limit switches 12, 15 there is prepared an associated group of AND-gates 22a, 22b and so forth and by means of the multiple outputs of the coder 21 controlled with a coded binary current signal, the place number of which corresponds to the output number of the coder and the number of gates in the groups 22a, 22b and so forth. Arranged following each of the last-mentioned groups is, for instance, a respective programmable reader storage 23a, 23b, 23c and 23d, having a corresponding number of inputs of the associated, address-controlled reader circuit (not here further shown). The outputs of such storage-reader circuits are connected by means of an appropriate multiplicity of OR-gates 24 with a digital-analog converter 25, which, in turn, controls by means of the input 14a the voltage source 14. Thus, there can be basically automatically adjusted for each value of the detection current a random selected value of the supply voltage, i.e. the electromotive force in the detection current circuit. This can be specifically accomplished according to a predeterminable subdivision into sections—additionally, separately for increasing and decreasing current—of the current-modulation range, each section having a clear correlation of voltage and current and with automatic, current-dependent progressive switching between the function sections as well as between positive and negative voltage in the current end values. Thus, there is shown the possibility of providing a general voltage-current-function generator for the cyclic throughpass of the magnetization characteristic curve, and the freedom of function programming within the current sections is only limited by the steps- or place number of the quantitizing binary system. Simpler and practical realizations are correspondingly possible by suitable oscillators of known construction, again, if desired, in conjunction with predetermined internal resistance of the source and/or non-linear elements for influencing the characteristic curves.

In the description to follow there will be given the basic mode of operation while assuming comparatively simple current-voltage characteristic curves, for the setting or adjustment of which there is only partially utilized the possibilities of the circuitry of FIG. 3, as well simplified as with linear magnetization characteristic curves, the latter however possessing saturation and hysteresis.

Figure 4:
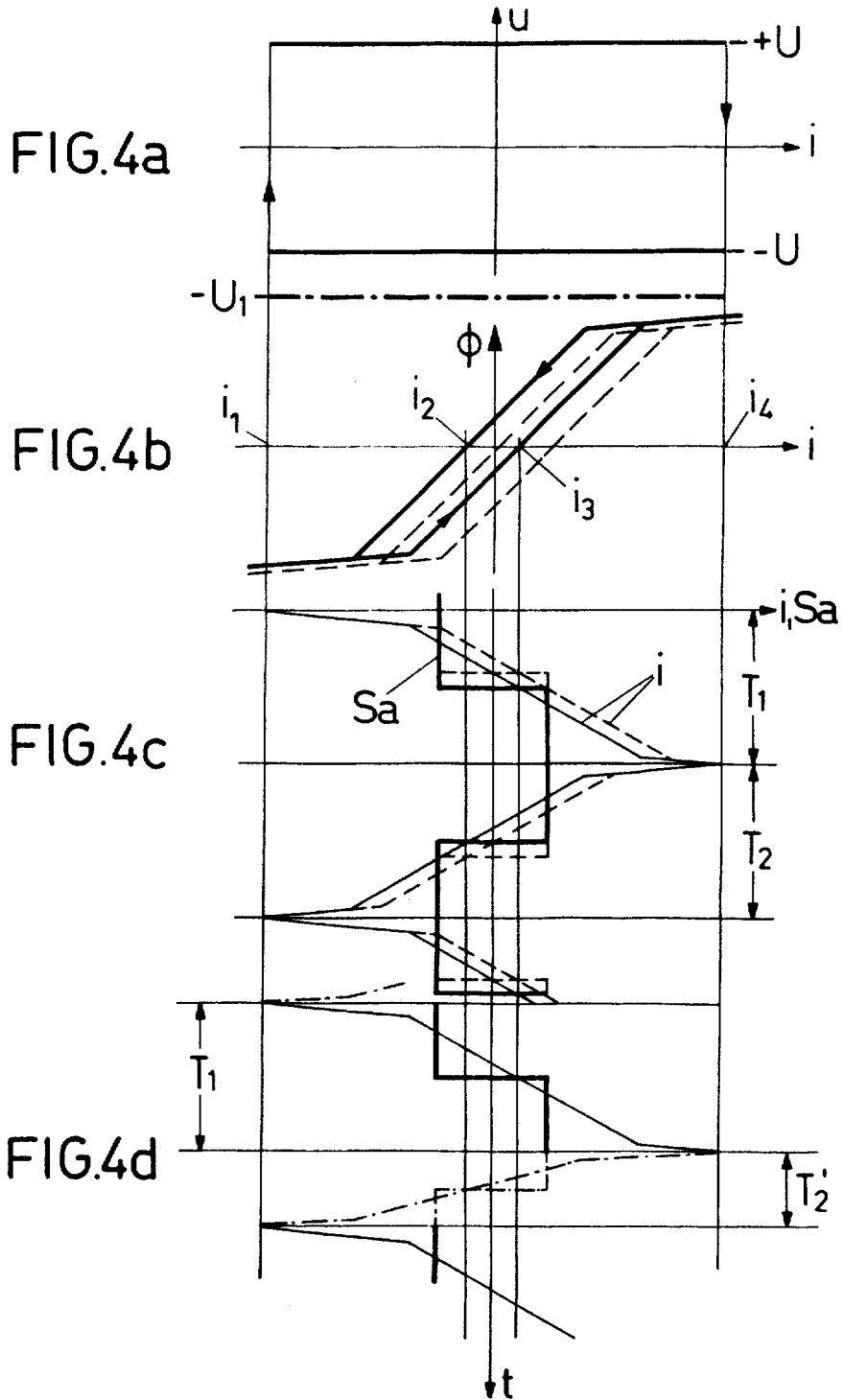
FIG. 4a is a special supply characteristic curve of an apparatus of the type shown in FIG. 3.
FIG. 4b illustrates a linearly simplified magnetization characteristic curve having hysteresis for the null current detection.
FIG. 4c illustrates a first time course of the detection current for null-symmetrical voltage of the supply source.
FIG. 4d is a second time course of the detection current for null-nonsymmetrical voltage of the supply source.

With the mode of operation according to FIGS. 4a and 4b there is initially again assumed a simple voltage-current characteristic curve with current-constant voltage branches at $+U$ and $-U$ as well as switching between such at the values $i=i_1$ and $i=i_4$, respectively, in the saturation regions of the full line null characteristic curves of FIG. 4b. Now there are set to deviate however—by means of the threshold value switch 15 of FIG. 3—the current threshold or limit values $i_2$ and $i_3$, and specifically at the null throughpasses (coercive points) of the null characteristic curve according to FIG. 4b. These limit or threshold values are employed while utilizing the detection-current-time course according to FIG. 4c for the determination of magnetization-dependent time intervals, and specifically, in the form of the binary output singal Sa of the threshold value switch 15 with its null throughpasses at $i_3$ in the ascending branch and at $i_2$ in the descending branch of the magnetization characteristic curve, i.e. with positive and negative supply voltage u.

In FIG. 4b there is further shown in broken lines a magnetization characteristic curve which is shifted by the magnetization which is to be detected, and in FIG. 4c equally the corresponding time course of i and Sa. The change of the pulse duty factor of Sa in the partial periods $T_1$ and $T_2$, here shown to be the same, appears clearly by virture of the magnetization which is to be detected. In the case of non-symmetrical supply voltage—indicated in FIG. 4a by the larger negative voltage $-U_1$—there is changed according to the showing of FIG. 4d the relationship of the partial period or cycle duration ($T_2'$ is shortened in contrast to $T_2$), however not the pulse duty factor in the partial periods and therefore also not the total-pulse duty factor of $S_a$ i.e. the null point of the detection signal. This voltage-independency of the null point constitutes a particular advantage.

Figure 5:
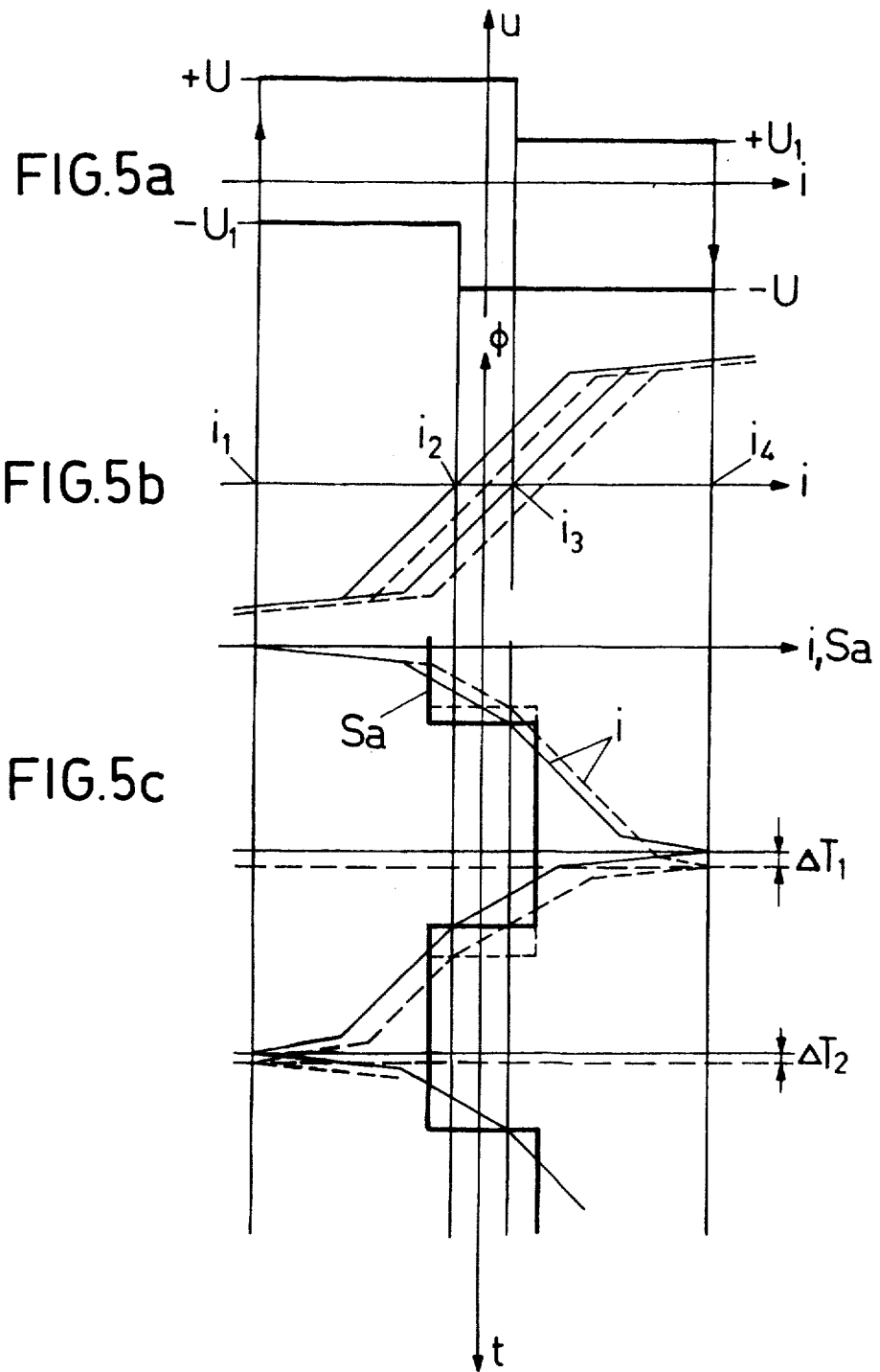
FIG. 5a illustrates a further supply characteristic curve with stepped voltage course.
FIG. 5b illustrates a magnetization characteristic curve corresponding to FIG. 4b for determining the detection current-time course.
FIG. 5c illustrates the detection current-time course resulting from the curves of FIGS. 5a and 5b.

With the mode of operation according to FIGS. 5a to 5c there is carried out at the current threshold or limit values $i_2$ and $i_3$ with decreasing and increasing current a change in the magnitude of the supply voltage. Thus, there is realized an additional non-linearity in the time course of $S_a$ and i as indicated in FIG. 5c, which however, as can be seen, has the effect of a more pronounced change of the pulse duty factor of $S_a$ in the second partial period and thus in total also the entire-pulse duty factor with a displacement or shift of the magnetization characteristic curve similar to FIG. 4b. This means a higher detection sensitivity.

Moreover, there is changed the duration of the partial periods as a function of the magnetization change according to FIG. 5c by $\Delta T_1$ and $\Delta T_2$, respectively, and specifically in the opposite sense, so that the relationship of the partial periods between the opposite polarity current peaks and which can be easily determined can be employed as the detection signal. Such then readily appears at the output 16 of the threshold value switch 12 in the form of the signal Sb.

Furthermore, there can be evaluated the pulse duty factor in the individual partial periods, if the binary detection signal—deviating from FIG. 4c and FIG. 5c—is not only switched at the intermediate current values $i_2$ and $i_3$, rather also at the end or terminal current values $i_1$ and $i_4$. If necessary, there is then to be incorporated into the circuit a rectifier arrangement for obtaining the detection signal. The detection signal appears for instance at the output 19 of the logic circuit 18 in the embodiment of FIG. 3.

As will be apparent from the showing of FIG. 5c, the changes in the opposite sense of the partial period or cycle durations for a shift of the magnetization characteristic curve are not completely of the same magnitude, so that there remains a change of the total period or cycle duration, i.e. the frequency of the cyclic throughpassage of the magnetization characteristic curve. This effect is attributable to the finite slope of the saturation branch of the magnetization characteristic curve in relationship to the mean characteristic curve branch and therefore actually is of lesser significance for the practically available magnetic materials.

Figure 6:
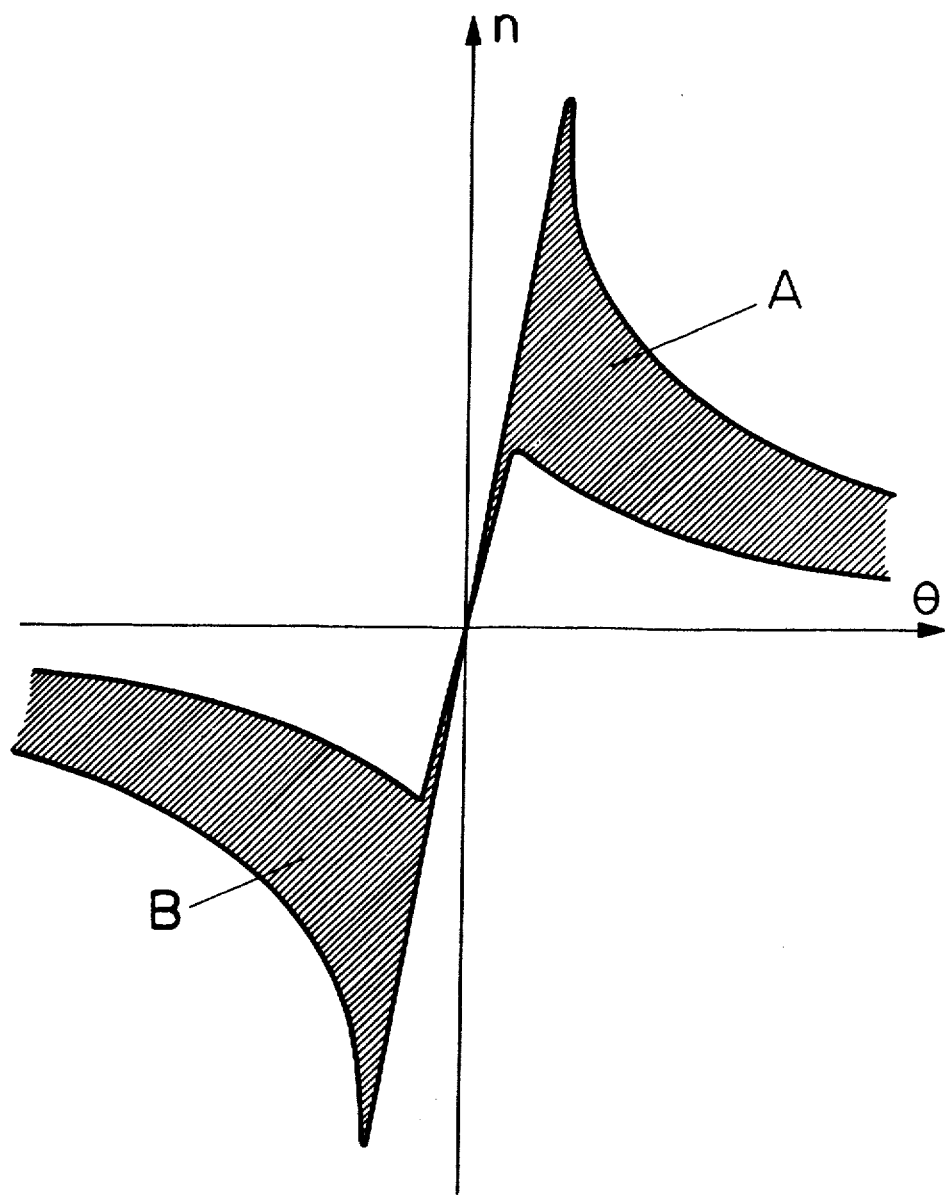
FIG. 6 is a graph of the pulse duty factor as the time-interval dependent detection signal as a function of a current to be detected with regard to null deviation.

The detection method of the invention is basically characterized by its low temperature sensitivity of the null point and also by its low temperature dependency of the detection sensitivity at the region to both sides of the null point of the detection signal. To this end FIG. 6 illustrates measurement results of the pulse duty factor n of $S_a$ with a method according to FIG. 5a to 5c as a function of a magnetization-current flow $\theta$ of the magnetic circuit, and specifically for a temperature range between $-40°$ C. and $+100°$ C. As will be apparent both of the previously mentioned effects are very slight at the null point region. In contrast thereto, the pronounced temperature dependency in the practically non-interesting marginal regions A and B shows that the strived for non-sensitivity is not governed by the magnetic material, rather by the circuitry and the detection technique.

While there are shown and described present preferred embodiments of the invention, it is to be distinctly understood that the invention is not limited thereto, but may be otherwise variously embodied and practiced within the scope of the following claims. Accordingly,

What I claim is:

1. A method for the detection of magnetization of a magnetic circuit, especially for the detection of a current flow and which is coupled with the magnetic circuit and producing such magnetization, comprising the steps of:
   generating by means of a detection voltage a detection-current flow which cyclically changes over time and having a wave form dependent upon the magnetization of the magnetic circuit, said detection-current flow being used for detection purposes;
   said detection-current flow being coupled with the magnetic circuit;
   converting said detection-current flow to a first output signal whose magnitude is dependent upon said detection-current flow;
   detecting time intervals in the wave form of said output signal between predetermined values of said output signal and dependent upon the magnetization of the magnetic circuit;
   generating second output signals at the beginning and end of said detected time intervals when said output signal is between said predetermined values and dependent upon the magnetization of the magnetic circuit; and
   forming a detection signal from said generated second output signals representing the magnetization of the magnetic current.

2. The method as defined in claim 1, wherein:
   the detection signal is formed as a function of time intervals which pass between predetermined values of the detection current during the cyclic magnetic flux change of the detection-current flow.

3. The method as defined in claim 2, wherein:
   the detection signal is formed as a function of time intervals between the appearance of predetermined values of opposite sign of the detection-current flow.

4. The method as defined in claim 3, further including the steps of:
   introducing the detection-current flow for the formation of detection signal values of at least approximately the same magnitude and opposite sign.

5. The method as defined in claim 1, wherein:
   the detection signal is formed as a function of time intervals which are governed at least at one side by the at least approximate appearance of the values null of the detection-current flow.

6. The method as defined in claim 1, wherein:
   the detection signal is formed as a function of time intervals which are governed at least at one side by the appearance of a predetermined value of the detection-current flow or and
   such predetermined value corresponds at least approximately to a turning point of the function of the magnetic flux with respect to the detection-current flow for a given magnetization.

7. The method as defined in claim 1, wherein:
   the detection signal is formed while utilizing a magnetic circuit with pronounced saturation as a function of time intervals which at least at one terminal point are governed by the appearance of a predetermined value of the detection-current flow; and
   such predetermined value of the detection-current flow for all of the values to be detected of the magnetization is located in a saturation region of the function of the magnetic flux with respect to the detection-current flow.

8. The method as defined in claim 1, wherein:
   the detection signal is formed while utilizing a magnetic circuit having a hysteresis-magnetization characteristic curve as a function of time intervals which at least at one terminal point are governed by the appearance of a predetermined value of the detection-current flow and
   said predetermined value of the detection-current flow at least approximately corresponds to a null throughpass of the function of the magnetic flux with respect to the detection-current flow at a given magnetization.

9. The method as defined in claim 1, wherein:
   the detection signal is formed as a function of a relationship of time intervals which at least at one terminal point are governed by the appearance of a predetermined value of the detection-current flow.

10. The method as defined in claim 9, wherein:
    the detection signal is formed as a function of the pulse duty factor of the cyclic time course of the detection-current flow.

11. The method as defined in claim 1, including the steps of:
    generating in the magnetic circuit magnetic flux-speed changes of alternating sign.

12. The method as defined in claim 11, including the steps of:
    generating in the magnetic circuit a magnetic flux with a time course which at least encompasses a pair of intervals possessing magnetic flux-speed changes of at least approximately coinciding magnitude and opposite sign.

13. The method as defined in claim 1, further including the steps of:
    generating in the magnetic circuit a magnetic flux change speed which is essentially constant over a time section thereof.

14. The method as defined in claim 12, further including the steps of:
    setting within a cycle of the time course of the magnetic flux change speed at least two intervals having constant but different magnitude and of the same sign of the magnetic flux change speed.

15. The method as defined in claim 1, further including the steps of:
    introducing a change in the magnetic flux change speed as a function of the attainment of at least one predetermined value of the detection-current flow.

16. The method as defined in claim 15, further including the steps of:
    accomplishing a sign reversal of the magnetic flux change speed as a function of the attainment of end values of opposite sign of the detection-current flow and wherein such end values for all values to be detected of the magnetization are located in saturation regions of the magnetization characteristic curve.

17. The method as defined in claim 16, including the steps of:
    accomplishing a change of the magnetic flux change speed as a function of an at least approximate attainment of the value null of the detection-current flow.

18. The method as defined in claim 16, including the steps of:

accomplishing a change of the magnetic flux change speed for a magnetic circuit with pronounced saturation at a value of the detection-current flow which for a given magnetization corresponds at least approximately to a turning point of the magnetization characteristic curve.

19. The method as defined in claim 16, further including the steps of:

accomplishing for a magnetic circuit having a hysteresis-magnetization characteristic curve a change of the magnetic flux change speed as a function of the attainment of a value of the detection-current flow which for a given magnetization corresponds at least approximately to a null throughpass of the magnetization characteristic curve.

20. The method as defined in claim 1, further including the steps of:

generating in the magnetic circuit a magnetic flux change speed which in accordance with a predetermined function is dependent upon the momentarily prevailing detection-current flow.

21. The method as defined in claim 20, further including the steps of:

carrying out a switching operation between different functions of the magnetic flux change speed in dependency upon the attainment of predetermined values of the detection-current flow.

22. The method as defined in claim 20, further including the steps of:

accomplishing a cyclic switching operation between at least two different functions of the magnetic flux change speed of the detection-current flow, which functions possess null position-free signs which are opposite to one another.

23. The method as defined in claim 19, wherein:

the characteristic curve of the magnetic flux is passed as a function of the detection-current flow from a first boundary value of the detection-current flow which is located in a saturation region and starting with at least approximately constant magnetic flux change speed to a first switching value of the detection-current flow with transition to a smaller magnitude of the magnetic flux change speed and thereafter to a boundary value of the detection-current flow in the opposite saturation region with transition to a magnetic flux change speed of opposite sign as well as thereafter by means of a second switching value of the detection-current flow with transition to a larger magnitude of the magnetic flux change speed back to the first boundary value of the detection-current flow.

24. An apparatus for the detection of magnetization of a magnetic circuit, especially for the detection of a current flow coupled with the magnetic circuit and producing such magnetization, comprising:

a magnetic circuit;

at least one detection current circuit coupled with the magnetic circuit for producing a detection-current flow;

current converting means for producing a first output signal whose magnitude is dependent upon said detection-current flow;

a supply voltage connected to said detection current circuit and possessing a cyclic course of its current or voltage over time;

at least one threshold value switch connected to receive said first output signal; and a time interval detector provided at the output side and in circuit with the threshold value switch for detecting time intervals between predetermined values of said first output signal.

25. The apparatus as defined in claim 24, wherein:

said threshold value switch is responsive to at least one current limit value in the detection current circuit.

26. The apparatus as defined in claim 25, wherein:

said threshold value switch is responsive to at least two null-symmetrical current limit values in the detection current circuit.

27. The apparatus as defined in claim 24, wherein:

said detection current circuit possesses a current source having a low internal resistance in comparison to the external resistance of such current circuit.

28. The apparatus as defined in claim 24, wherein:

a time interval-ratio detector is arranged at the output of the threshold value switch.

29. The apparatus as defined in claim 24, wherein:

said threshold value switch delivers a binary, null-symmetrical output signal.

30. The apparatus as defined in claim 24, wherein:

said time interval detector comprises a low-pass filter element.

31. The apparatus as defined in claim 24, wherein:

said current converting means is connected with a current source having a current-voltage characteristic curve possessing a hysteresis loop which is passed through cyclically.

* * * * *